United States Patent [19] [11] Patent Number: 4,804,560
Shioya et al. [45] Date of Patent: Feb. 14, 1989

[54] METHOD OF SELECTIVELY DEPOSITING TUNGSTEN UPON A SEMICONDUCTOR SUBSTRATE

[75] Inventors: Yoshimi Shioya, Kuwana; Yasushi Oyama, Kodaira; Norihisa Tsuzuki, Higashimurayama; Mamoru Maeda, Tama; Masaaki Ichikawa, Hiratsuka; Fumitake Mieno; Shin-ichi Inoue, both of Kawasaki; Yasuo Uo-ochi, Tokyo; Akira Tabuchi; Atsuhiro Tsukune, both of Kawasaki; Takuya Watanabe, Sagamihara; Takayuki Ohba, Yokohama, all of Japan

[73] Assignee: Fujitsu Limited, Kawasaki, Japan

[21] Appl. No.: 26,900

[22] Filed: Mar. 17, 1987

[30] Foreign Application Priority Data

Mar. 17, 1986 [JP] Japan .................................. 61-58753

[51] Int. Cl.$^4$ .......................... B05D 5/12; C23C 16/00
[52] U.S. Cl. ..................................... 427/125; 427/253; 427/255; 427/255.1; 156/646; 156/664; 437/192; 437/228
[58] Field of Search ............... 437/187, 192, 203, 228, 437/937; 156/646, 651, 653, 664; 427/253, 255, 255.1, 125, 124

[56] References Cited

U.S. PATENT DOCUMENTS 4,404,235 9/1983 Tarng et al. ..................... 437/192
4,412,119 10/1983 Komatsu et al. ................. 156/643
4,517,225 5/1985 Broadbent ............................. 427/89
4,552,783 11/1985 Stoll et al. .......................... 437/187

Primary Examiner—Michael Lusignan
Assistant Examiner—M. A. Burke
Attorney, Agent, or Firm—Staas & Halsey

[57] ABSTRACT

A method of selectively depositing tungsten upon a silicon semiconductor substrate. A silicon substrate is coated with a masking film of PSG or SiO$_2$ that is patterned to provide an opening for forming an electrode or wiring. On a portion of the substrate in the opening, a layer of tungsten having a thickness of approximately 2000 Å is deposited by a CVD method from an atomosphere containing a gaseous mixture of WF$_6$ and H$_2$. During this processing, tungsten nucleuses deposit on the surface of the masking film as well. Before such nucleuses form a film, the deposition processing is discontinued and H$_2$ gas is fed into the CVD apparatus to produce HF, which etches the surface of the masking film, and thus tungsten nucleuses are removed. The deposition and removal steps are repeated several times until the height of the deposited tungsten and the thickness of the masking film are essentially equal to present a flat surface. Aluminum film is deposited on the flat surface and patterned by lithography. The flat aluminum deposition allows fabrication of accurate and reliable wirings and facilitates production of VLSI of submicron order.

2 Claims, 2 Drawing Sheets

METHOD OF SELECTIVELY DEPOSITING TUNGSTEN UPON A SEMICONDUCTOR SUBSTRATE

BACKGROUND OF THE INVENTION

1. Field of the Invention

This invention relates to a method of depositing tungsten upon a semiconductor substrate. More particularly, it relates to selective deposition of a thick layer of tungsten for use as an electrode or wiring for the semiconductor device.

2. Description of the Related Art

In semiconductor LSI (Large Scale Integrated Circuit) devices, polycrystalline silicon has been widely employed for fabricating electrodes and electrical wiring. However, the lowering of the electrical resistance of polycrystalline silicon is limited because it is a semiconductor. Therefore, a refractory material, such as tungsten, or tungsten silicide has been employed in place of the polycrystalline silicon. The fabrication of tungsten electrodes or wiring is schematically explained hereinafter referring to FIG. 1. The surface of a silicon semiconductor substrate element is coated with a masking film 2 formed from a phospho-silicate glass (referred to hereinafter as $SiO_2$) material generally to a thickness of approximately 1 μm. Masking film 2 is patterned using generally known lithography techniques, so that an opening in the form of contact hole 3 is provided at the portion of the substrate on which tungsten is to be deposited. The substrate 1 having the masking film 2 thereon is loaded into a conventional apparatus used for chemical vapor deposition (CVD). A reaction gas, such as a gaseous mixture of tungsten hexafluoride (referred to hereinafter as $WF_6$) and hydrogen (referred to hereinafter as $H_2$) gas, is fed into the CVD apparatus, and the gas pressure is reduced to the range of 0.1 to 0.5 Torr, and then the substrate 1 having the masking film 2 thereon is heated. Chemical reactions occur in accordance with the following relationships:

$$2 WF_6 + 3 Si = 2 W + 3 SiF_4 \qquad (1)$$

$$WF_6 + 3 H_2 = W + 6 HF \qquad (2)$$

The exposed silicon on the substrate 1 is active to reduce the $WF_6$ and thus produce HF (hydrofluoric acid) and W (tungsten). The produced W is deposited upon the surface of the exposed portion 1' of the silicon substrate 1. The reducing reaction pursuant to relationship (1) does not take place in areas covered by the $SiO_2$ masking film 2, and therefore little tungsten deposits on the masking film 2. Thus, deposition of tungsten occurs selectively. However, when deposited tungsten forms a film at the exposed portion 1' of the silicon substrate 1, such formed tungsten film prevents the silicon substrate from reacting further with $WF_6$ in the reaction gas, and the thickness of the deposited tungsten film will generally be no greater than approximately 1000Å. In order to continue supplying tungsten to the surface film, $H_2$ is admixed with the $WF_6$ in the reaction gas. $H_2$ reacts in accordance with relationship (2) not only to produce additional thickness of tungsten on the previously deposited tungsten, but also to produce new tungsten nucleuses on the surface of the masking film 2. Such nucleuses will continue growing so as to form a second tungsten film that could imperil the function of the masking film by electrical isolation. Such additional film is also not easily removed. Therefore, the reaction in accordance with relationship (2) must be discontinued before such additional film is formed on the masking film 2. The result is that the thickness of the tungsten film 4 deposited on the exposed silicon substrate 1' cannot be more than about 3000Å and typically is about 2000Å. Such thickness is sufficient for the deposited tungsten 4 to perform as an electrical conductor. However, the large difference between the thickness of the masking film 2 (approximately 1 μm) and of the deposited tungsten film 4 (approximately 2000Å) causes problems during later processing aimed at fabricating reliably continuous aluminum wiring 5 thereon and connecting the deposited tungsten, i.e., an electrode, to an outside connection. In other words, the accuracy of the photo lithography process for depositing the aluminum film 5 on such a non-flat surface is, of course, diminished, and also, the sharp edges of the masking film 2 may cause discontinuities to occur during aluminum deposition. This problem becomes impermissibly serious in connection with the fabrication of VLSI (Very Large Scale Integrated Circuit) of sub-micron order. Therefore, methodology has been needed to facilitate fabrication of a thick tungsten film so as to present a substantially flat surface together with the surface of a masking film.

SUMMARY OF THE INVENTION

It is an object of the invention, therefore, to provide a method for selectively depositing a thick tungsten film on a silicon semiconductor substrate, so that the surface of the deposited tungsten and the surface of the masking film are coplanar in order to allow accurate and reliable patterning of an aluminum film thereon.

Using a CVD method, tungsten is selectively deposited on the exposed portions of a semiconductor substrate through openings in a masking film of phosphosilicate glass (PSG) or silicon dioxide ($SiO_2$) coated on the silicon substrate. Even though the deposition process is slow, some tungsten is deposited on the masking film. Before the tungsten film is completely formed, the tungsten deposition on the masking film is removed by heating the substrate in hydrogen gas which produces hydrofluoric acid (HF) from residual $WF_6$, or by wet etching in a HF solution, or by dry etching in nitrogen trifluoride ($NF_3$) gas. Thereafter, further deposition of tungsten is carried out upon the previously deposited tungsten on the substrate using the same deposition process as was used initially. Repetition of above-described processes, i.e., deposition and removal, allows the tungsten deposition to become as thick an 1 um which is substantially the same thickness as that of the masking film. Thus, the surfaces of the deposited tungsten and the masking film form a flat surface. Therefore, during further processing, an aluminum film can be deposited and patterned accurately and reliably on the flat surface, and fabrication of VLSI of sub-micron order can be achieved.

The above-mentioned features and advantageous of the present invention, together with other objects and advantages, which will become apparent, will be more fully described hereinafter.

BRIEF DESCRIPTION OF THE DRAWINGS

The same or similar reference numerals are used throughout the drawings to designate the same or corresponding parts.

DESCRIPTION OF THE PREFERRED EMBODIMENTS

Figure 1:
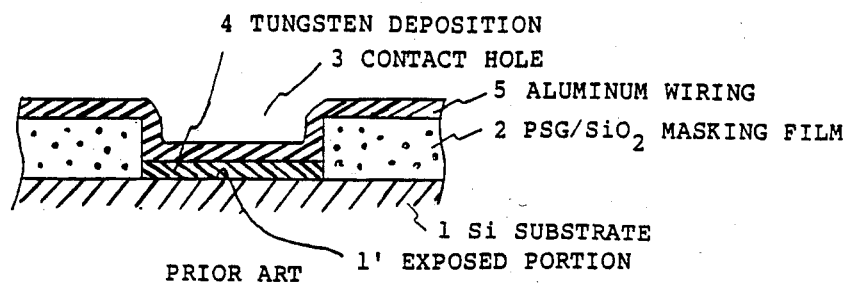
FIG. 1 is a cross-sectional elevational view of tungsten deposited according to the prior art.
Figure 2A:
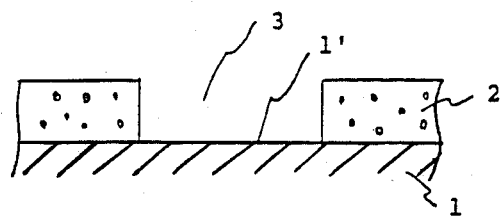
FIGS. 2a through 2e are cross-sectional elevational views which schematically illustrate the steps of depositing tungsten according to the present invention.

The respective steps of the preferred embodiments of the method of the present invention are described with reference to FIGS. 2a through 2e. FIG. 2a shows a semiconductor substrate 1 which is generally made of a silicon material containing dopants in a known manner. A masking film 2 is coated on the surface of substrate 1. The masking film 2 is generally made of PSG or $SiO_2$, and is approximately 1 μm thick. An opening, i.e., a contact hole 3, is made by patterning masking film 2 using known lithography techniques. Thus, a portion 1' of the surface of substrate 1 is exposed at the bottom of contact hole 3. The substrate 1 coated with the masking film 2 as shown in FIG. 2a is loaded in a CVD apparatus and CVD-processed according to the following conditions:

$WF_6$ supplied at a flow rate of: 100 cc/min.
$H_2$ supplied at a flow rate of: 6 liter/min.
Gas pressure: 0.3 to 0.5 Torr
Temperature of the substrate: 325° C.

Figure 2B:
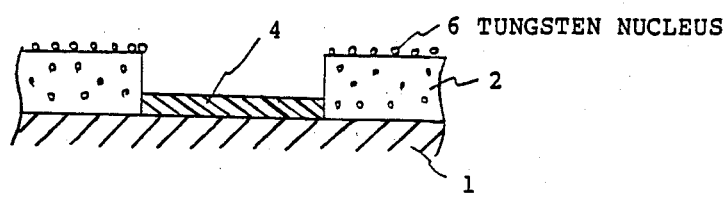

Chemical reactions take place in accordance with relationships (1) and (2) set forth above in the description of the prior art. The masking material is etched out by the HF produced during CVD processing, so that the surface of the masking film becomes rough. The microscopically sharp edges of the roughened surface of the masking film provide likely sites for the growth of tungsten. CVD processing is continued until an island structure, consisting of many nucleuses 6 of tungsten, is produced and can be seen on the surface of the masking film 2, as shown in FIG. 2b. At this point in time, the tungsten layer 4 that has been deposited on the exposed surface 1' of the silicon substrate 1 is only about 2000 to 3000Å thick. It takes approximately 30 minutes for processing to proceed to this stage. After such island structures have been produced, the undesirable tungsten nucleuses 6 on the masking film 2 grow quickly, and thus the selectivity of the deposition process is now low.

Figure 2C:
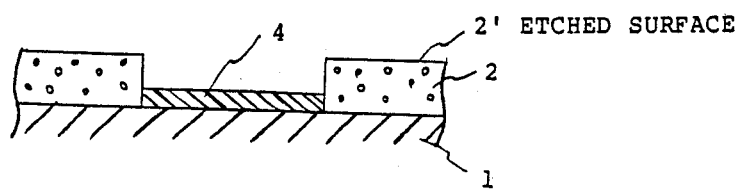

The tungsten nucleuses 6 on masking film 2 are removed, as shown in FIG. 2c. The removal is carried out by one of the following methods. The first method is to use hydrogen gas. When the tungsten deposition process in the CVD apparatus has reached the point described above, hydrogen gas is fed into the CVD apparatus while the loaded substrate 1 remains as is. The conditions are as follows:

$H_2$ gas supply: 400 cc/min.
Temperature of the substrate: 325° C.
Gas pressure: 0.3 to 0.5 Torr $H_2$ reacts with the $WF_6$ remaining in the CVD apparatus as a result of the previous deposition process to thus produce HF gas which etches the $SiO_2$ content in the surface areas of the masking film 2 providing support for tungsten nucleuses 6 thereon, and thus the tungsten nucleuses 6 are detached and removed. It typically takes 10 minutes for this processing. This method is an efficient method because the same apparatus can be used continuously for both the deposition and removal of the tungsten without the need for opening the apparatus and taking out the substrate.

Another method for removing the tungsten nucleuses 6 is by wet etching using an HF solution. Such HF etching may be accomplished using any one of the following three processes:

a. Washing the masking film first in a dilute HF solution and next in water.
b. Washing the masking film first in an $H_2O_2$ (hydrogen peroxide) solution, next in a dilute HF solution, and next in water.
c. Washing the masking film first in a solution of $NH_4OH$ (ammonia) $+H_2O_2$, next in a dilute HF solution, and next in water.

Both $H_2O_2$ and $NH_4OH+H_2O_2$ are active for etching the tungsten nucleuses. The HF acts in the same way as described above.

The third method for removing the tungsten nucleuses 6 is by dry etching using a gaseous mixture of $NF_3$ and $H_2$ in the CVD apparatus following the tungsten deposition process. The conditions are as follows:

$NF_3$ gas supply: 100 cc/min.
$H_2$ gas supply: 400 cc/min.
Gas pressure: 0.1 to 0.2 Torr
Temperature of the substrate: 400 to 500° C.

HF is produced in accordance with the following relationship:

$$2 NF_3 + 3 H_2 = N_2 + 6 HF$$

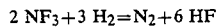

The produced HF in gaseous form acts in the same way as described above. In the process of removing tungsten nucleuses, the masking film 2 is etched to a depth of as much as several hundred angstroms.

Figure 2D:
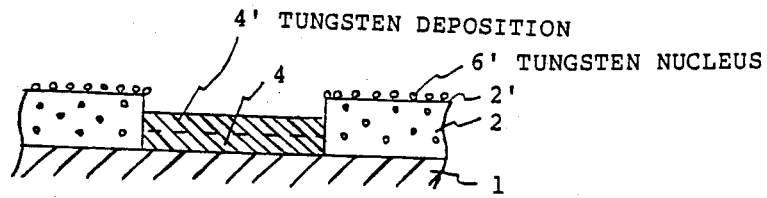
Figure 2E:
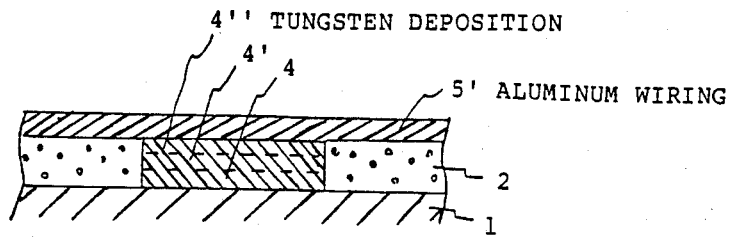

After removal of the undesirably deposited tungsten nucleuses 6 on the masking film 2, the CVD processing is resumed as before and additional tungsten deposition is carried out, thus tungsten film 4' is additionally deposited on the previous deposition 4. During such additional depositing of tungsten film 4', new tungsten nucleuses 6' are undesirably deposited again on the etched surface 2' of masking film 2 in the same way as during the first deposition process. This condition is shown in FIG. 2d. Then, the new tungsten nucleuses 6' on masking film 2 are removed, again using one of the removal processes described above. This condition is not shown in the drawings. After repeating the processes of tungsten deposition and tungsten nucleus removal several times, for example three times, the height of tungsten deposition 4+4'+4''.. in contact hole 3 becomes substantially the same as the thickness of the masking film 2, and the resultant surface becomes flat, as shown in FIG. 2e. As thick as 1 μm deposition can be achieved after proper repetition of the processings.

An aluminum film 5' (FIG. 2e) may then be deposited on the flat surface presented by the deposited tungsten 4+4'+4''.. and the masking film 2, and patterned using widely known methods, such as sputtering and lithography, for connecting the deposited tungsten to other parts of the semiconductor device or to an outside connection. Because of the good flatness of the surface on which the aluminum wiring is patterned, the wiring may be accurately and reliably fabricated. Thus, through the use of the method of the present invention, fabrication of VLSI of sub-micron order is facilitated.

In the above-described embodiment, the tungsten deposited in the contact hole is referred to as an electrode. However, it is apparent that the present invention is applicable to tungsten deposited for wirings as well.

The many features and advantages of the invention are apparent from the detailed specification and thus, it is intended by the appended claims to cover all such features and advantages which fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A method of selectively depositing tungsten upon a semiconductor substrate, comprising the steps of:

forming a patterned mask of PSG or SiO$_2$ on the substrate;

depositing tungsten upon a part of the semiconductor substrate which is not covered by said patterned mask and coincidentally depositing tungsten nucleuses on said mask by CVD processing in a CVD apparatus using a gaseous atmosphere containing WF$_6$ and H$_2$;

removing said tungsten coincidentally deposited upon a surface of the patterned mask by heating the mask in said apparatus in an atmosphere containing H$_2$ and residual WF$_6$ remaining from said CVD processing to thereby etch the mask; and depositing tungsten upon said tungsten deposited previously upon said semiconductor substrate.

2. A method of selectively depositing tungsten upon a semiconductor substrate according to claim 1, wherein the atmosphere in which the mask is heated to effect removal of deposited tungsten contains NF$_3$ gas whereby the mask is etched to facilitate removal of the tungsten.

* * * * *